US010581431B2

(12) United States Patent
Mcintyre et al.

(10) Patent No.: US 10,581,431 B2
(45) Date of Patent: Mar. 3, 2020

(54) SELF CAPACITANCE DRIVE OFFSET CANCELLATION IN TOUCH CONTROLLER INTEGRATED CIRCUITS

(71) Applicant: QUALCOMM Incorporated, San Diego, CA (US)

(72) Inventors: James Hendrie Mcintyre, San Diego, CA (US); Sameer Wadhwa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 76 days.

(21) Appl. No.: 15/947,547

(22) Filed: Apr. 6, 2018

(65) Prior Publication Data

US 2019/0310725 A1 Oct. 10, 2019

(51) Int. Cl.
*H03K 17/96* (2006.01)
*G06F 3/041* (2006.01)
*G06F 3/044* (2006.01)

(52) U.S. Cl.
CPC .......... *H03K 17/962* (2013.01); *G06F 3/044* (2013.01); *G06F 3/0414* (2013.01); *G06F 3/0418* (2013.01); *G06F 2203/04112* (2013.01); *G09G 2310/0264* (2013.01); *H03K 2217/960705* (2013.01); *H03K 2217/960735* (2013.01)

(58) Field of Classification Search
CPC ................... G06F 3/0414; G06F 3/044; G06F 2203/04112; G09G 2310/0264
See application file for complete search history.

(56) References Cited

U.S. PATENT DOCUMENTS

| 8,154,310 | B1 | 4/2012 | Maharyta et al. |
| 8,610,443 | B1 | 12/2013 | Ryshtun et al. |
| 8,614,587 | B1 | 12/2013 | Ogirko et al. |
| 8,854,107 | B2* | 10/2014 | Kwon .................. G06F 3/0416 327/336 |
| 9,552,102 | B2 | 1/2017 | Shen et al. |
| 9,746,974 | B2 | 8/2017 | Ellis et al. |
| 9,778,301 | B2 | 10/2017 | Maharyta et al. |
| 2009/0153152 | A1 | 6/2009 | Maharyta et al. |
| 2012/0218222 | A1 | 8/2012 | Shen et al. |
| 2013/0249825 | A1* | 9/2013 | Kang .................. G06F 3/03547 345/173 |
| 2015/0035787 | A1 | 2/2015 | Shahparnia et al. |
| 2015/0212643 | A1* | 7/2015 | Lee ....................... G06F 3/0416 345/174 |

(Continued)

OTHER PUBLICATIONS

International Search Report and Written Opinion—PCT/US2019/017444—ISA/EPO—dated Apr. 18, 2019.

*Primary Examiner* — Muhammad N Edun
(74) *Attorney, Agent, or Firm* — Loza & Loza, LLP/Qualcomm

(57) ABSTRACT

An interface circuit includes an amplifier having a first input, a second input, and an output, a drive capacitor coupled to the first input of the amplifier, and a feedback path coupled between the output of the amplifier and the second input of the amplifier. The interface circuit also includes a current driver coupled to the first input of the amplifier and the second input of the amplifier, wherein the current driver is configured to drive the drive capacitor with a first current, and to drive a touch panel capacitor coupled to the second input of the amplifier with a second current.

24 Claims, 7 Drawing Sheets

(56) References Cited

U.S. PATENT DOCUMENTS

2015/0280668 A1* 10/2015 Huang ................. H03G 1/0088
                                                              330/254
2016/0091999 A1     3/2016  Dattalo
2018/0062508 A1     3/2018  Yao et al.

* cited by examiner

SELF CAPACITANCE DRIVE OFFSET CANCELLATION IN TOUCH CONTROLLER INTEGRATED CIRCUITS

BACKGROUND

Field

Aspects of the present disclosure relate generally to touch panels, and more particularly, to touch panels with capacitive touch sensors.

Background

A touch panel includes an array of touch sensors overlaid on a display. The touch sensors may employ capacitive sensing, in which a user's finger is detected by detecting changes in the capacitances (e.g., mutual capacitances and/or self capacitances) of the sensors caused by the user's finger.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an interface circuit. The interface circuit includes an amplifier having a first input, a second input, and an output, a drive capacitor coupled to the first input of the amplifier, and a feedback path coupled between the output of the amplifier and the second input of the amplifier. The interface circuit also includes a current driver coupled to the first input of the amplifier and the second input of the amplifier, wherein the current driver is configured to drive the drive capacitor with a first current, and to drive a touch panel capacitor coupled to the second input of the amplifier with a second current.

A second aspect relates to a method for operating an interface circuit to a touch panel. The interface circuit includes an amplifier, a drive capacitor coupled to a first input of the amplifier, and a feedback path coupled between an output of the amplifier and a second input of the amplifier. The method includes driving the drive capacitor with a first current, and driving a touch panel capacitor coupled to the second input of the amplifier with a second current.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A touch panel includes an array of touch sensors overlaid on a display. The touch sensors may employ capacitive sensing, in which a user's finger is detected by detecting changes in the capacitances (e.g., mutual capacitances and/or self capacitances) of the sensors caused by the user's finger.

A touch panel typically includes a first set of electrodes and a second set of electrodes arranged in a grid, in which the first set of electrodes run perpendicular to the second set of electrodes. The first set of electrodes and the second set of electrodes form mutual capacitors due to mutual coupling capacitances between the electrodes. Each mutual capacitor is located at the intersection of one of the electrodes in the first set of electrodes and one of the electrodes in the second set of electrodes, and acts as a capacitive touch sensor. In this case, the presence of a user's finger at or near the location of a mutual capacitor is detected by detecting changes in the capacitance of the mutual capacitor caused by the user's finger. Typically, a user's finger decreases the capacitance of a mutual capacitor by disturbing electric fields between the respective electrodes.

In addition, each of the electrodes in the touch panel forms a respective self capacitor due to capacitance between the electrode and ground. Each self capacitor may be used as a capacitive touch sensor to detect the presence of a user's finger at or near the respective electrode. In this case, the presence of a user's finger at or near an electrode is detected by detecting changes in the capacitance of the respective self capacitor caused by the user's finger. Typically, a user's finger increases the capacitance of a self capacitor by adding capacitance between the finger and the respective electrode to the self capacitor. Self capacitors reduce the ability of a touch controller to accurately resolve the locations of multiple fingers on the touch panel compared with mutual capacitors due to ghosting. However, self capacitors typically require less power than mutual capacitors, and can therefore be used in certain applications to conserve power.

Figure 1:
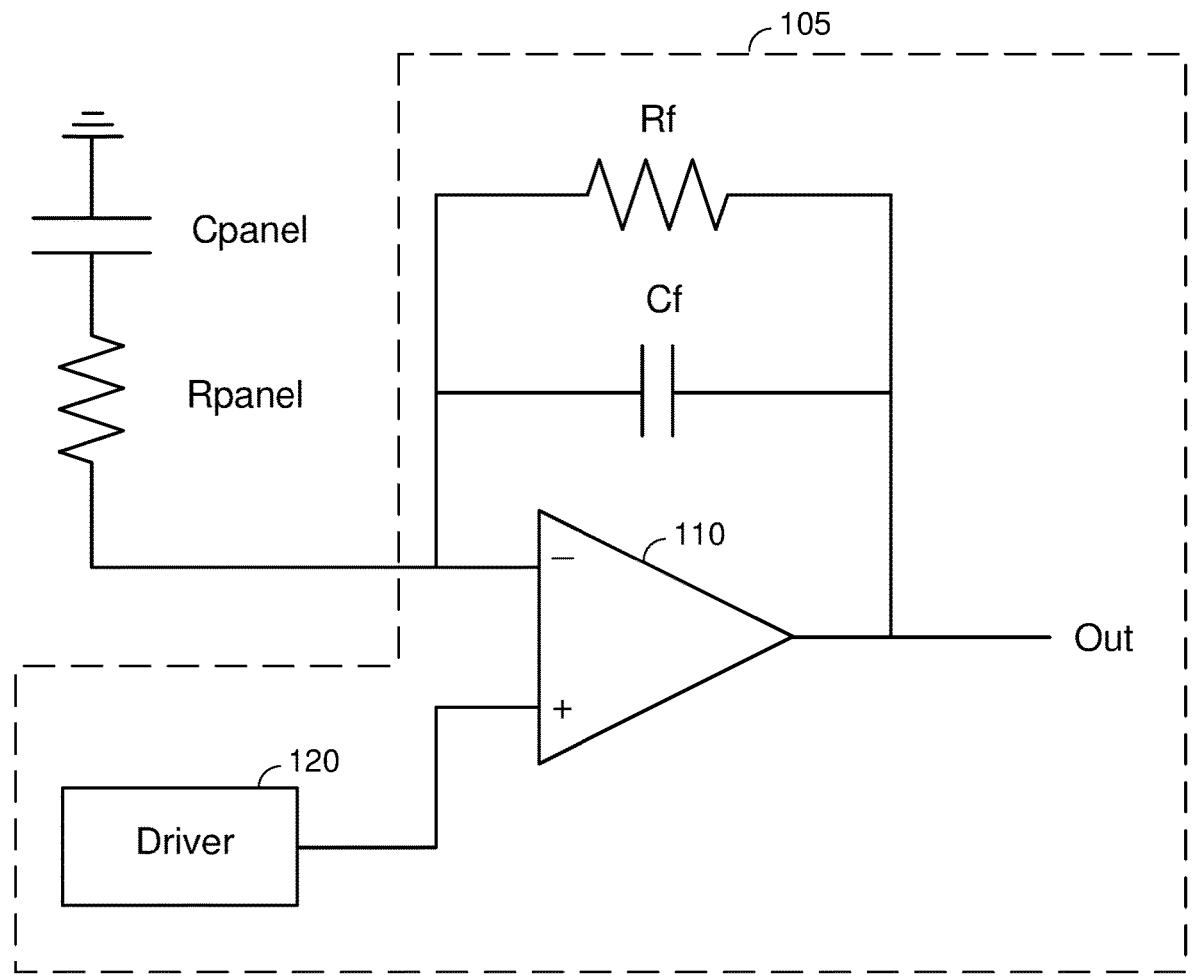
FIG. 1 shows an example of an interface circuit for a touch panel.

FIG. 1 shows an example of an interface circuit 105 configured to drive and sense the capacitance of a touch panel capacitor (denoted "Cpanel") in a touch panel. The touch panel capacitor Cpanel may include a self capacitor formed by one of the electrodes in the touch panel, as discussed above. Also shown in FIG. 1 is a resistor (denoted "Rpanel") modeling the resistance of the electrode corresponding to the touch panel capacitor Cpanel. Note that the capacitance and resistance of the electrode may be distributed along the electrode, in which case the touch panel capacitor Cpanel and resistor Rpanel shown in FIG. 1 represent a lumped model approximation of the capacitance and resistance. The interface circuit 105 may be integrated on a chip coupled to the touch panel. Although one interface circuit 105 is shown in FIG. 1, it is to be appreciated that a touch controller may include multiple instances (i.e., copies) of the interface circuit 105, in which each instance of the interface circuit is coupled to a respective touch panel capacitor (e.g., self capacitor) in the touch panel.

The interface circuit 105 includes an amplifier 110 (e.g., a low noise amplifier), a feedback capacitor (denoted "Cf") coupled between the output of the amplifier 110 and the negative input of the amplifier 110, and a feedback resistor (denoted "Rf") coupled between the output of the amplifier 110 and the negative input of the amplifier 110. The output of the amplifier 110 is labeled "Out" in FIG. 1. The feedback capacitor Cf and the feedback resistor Rf form a feedback path between the output of the amplifier 110 and the negative input of the amplifier 110. The interface circuit 105 also includes a voltage driver 120 coupled to the positive input of the amplifier 110. The voltage driver 120 is configured to drive the positive input of the amplifier 110 with a voltage drive signal.

In operation, the amplifier 110 back drives the touch panel capacitor Cpanel according to the voltage drive signal input to the positive input of the amplifier 110 by the voltage driver 120. This is because the feedback path between the output of the amplifier 110 and the negative input of the amplifier 110 causes the output of the amplifier 110 to supply current to the touch panel capacitor Cpanel through the feedback path such that the voltage at the negative input of the amplifier 110 tracks the voltage at the positive input of the amplifier 110. In other words, the amplifier 110 supplies charge to the touch panel capacitor Cpanel through the feedback path such that the voltage at the negative input of the amplifier 100 is approximately equal to the voltage of the drive signal at the positive input of the amplifier 110. The amount of charge supplied to the touch panel capacitor Cpanel for a given drive signal depends on the capacitance of the touch panel capacitor Cpanel.

The amplifier 110 outputs an output signal, in which the amplitude of the output signal depends on the amount of charge supplied to the touch panel capacitor Cpanel by the amplifier 110. Since the amount of charge supplied to the touch panel capacitor Cpanel for a given drive signal depends on the capacitance of the touch panel capacitor Cpanel, the amplitude of the output signal also depends on the capacitance of the touch panel capacitor Cpanel. Thus, the output signal may be used to sense the capacitance of the touch panel capacitor Cpanel, and therefore sense changes in the capacitance of the touch panel capacitor Cpanel caused by the presence of a user's finger. This information may be used to detect the presence of the user's finger. In this regard, the output of the amplifier 110 may be coupled to a processor (not shown) that detects the user's finger by detecting changes in the output signal caused by the presence of the user's finger.

The absolute capacitance of the touch panel capacitor Cpanel does not need to be sensed in order to detect the user's finger. Only the change in the capacitance caused by the user's finger needs to be sensed to detect the user's finger. The change in the capacitance caused by the user's finger may be referred to as a delta capacitance, which may be defined as the difference between the capacitance of the touch panel capacitor Cpanel in the presence of the user's finger and the baseline capacitance of the touch panel capacitor Cpanel (i.e., the capacitance of the touch panel capacitor Cpanel without the user's finger). Because only the delta capacitance needs to be detected to detect the user's finger, the dynamic range of the amplifier 110 may be increased by reducing the portion of the output signal due to the baseline capacitance of the touch panel capacitor Cpanel.

Figure 2:
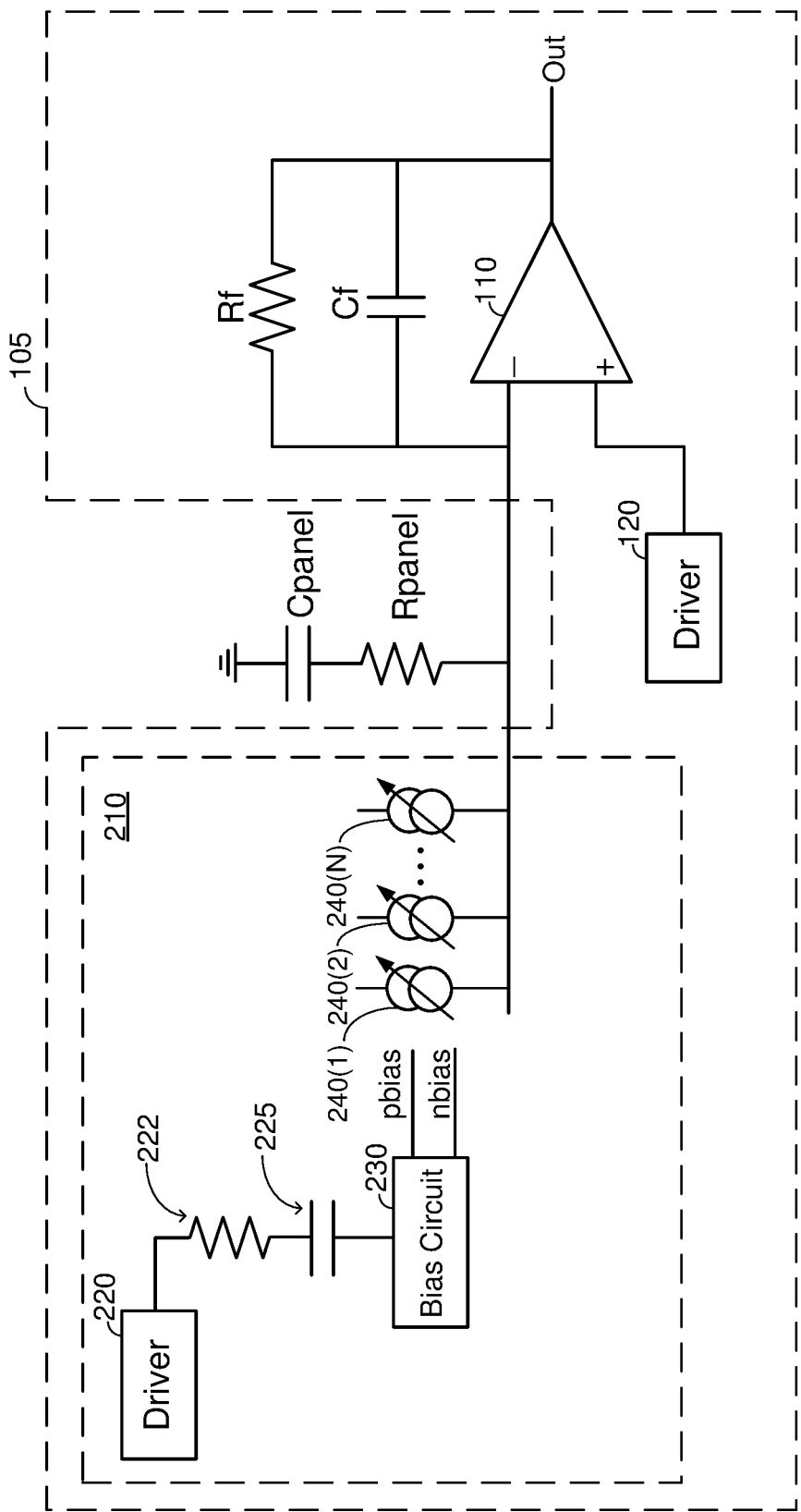
FIG. 2 shows an example of the interface circuit with offset cancellation.

In this regard, FIG. 2 shows an example of an offset cancellation circuit 210 configured to reduce the portion of the output signal due to the baseline capacitance of the touch panel capacitor Cpanel. The offset cancellation circuit 210 includes a voltage driver 220, an on-chip resistor 222, an on-chip capacitor 225, a bias circuit 230, and current sources 240(1)-240(N). The current sources 240(1)-240(N) are coupled to the touch panel capacitor Cpanel. The capacitance of the on-chip capacitor 225 approximately matches the baseline capacitance of the touch panel capacitor Cpanel, and the resistance of the on-chip resistor 222 approximately matches the resistance of the resistor Rpanel.

In operation, the voltage driver 220 drives the on-chip capacitor 225 through the on-chip resistor 222 with approximately the same drive signal as the voltage driver 120 coupled to the positive input of the amplifier 110. The on-chip capacitor 225 differentiates the voltage of the drive signal, generating a current that is input to the bias circuit 230. The bias circuit 230 biases the current sources 240(1)-240(N) based on the input current such that the current sources provide a current to the touch panel capacitor Cpanel based on the input current, which generates a voltage on the touch panel capacitor Cpanel.

When a user's finger is not present, the voltage on the touch panel capacitor Cpanel generated by the current from the current sources 240(1)-240(N) approximately matches the voltage of the drive signal at the positive input of the amplifier 110. Thus, for the case in which the user's finger is not present, the offset cancellation circuit 210 supplies the touch panel capacitor Cpanel with the charge needed to approximately match the voltage on the touch panel capacitor Cpanel to the voltage of the drive signal.

When the user's finger is present, the change in the capacitance of the touch panel capacitor Cpanel (i.e., the delta capacitance) caused by the user's finger changes the amount of charge needed to match the voltage on the touch panel capacitor to the voltage of the drive signal. The charge difference is provided by the output of the amplifier 110 through the feedback path. Thus, in this example, the amplifier 110 only needs to provide the charge difference corresponding to the delta capacitance, and the output signal of the amplifier 110 is indicative of the delta capacitance. This significantly reduces the portion of the output signal of the amplifier 110 due to the baseline capacitance of the touch panel capacitor Cpanel, thereby increasing the dynamic range of the amplifier 110.

A drawback of the offset cancellation circuit 210 in FIG. 2 is that it requires a relatively large on-chip capacitor 225 matched to the touch panel capacitor Cpanel. As a result, the on-chip capacitor 225 takes up a large area on the chip. Another drawback is that the current sources 240(1)-240(N) introduce transistor flicker noise into the output signal. The flicker noise may be reduced by making the width and length of the transistors in the current sources 240(1)-240(N) large. However, this approach may require large transistors that take up a large area on the chip. Accordingly, there is a need for an offset cancellation circuit that overcomes one or more of the above drawbacks.

Figure 3:
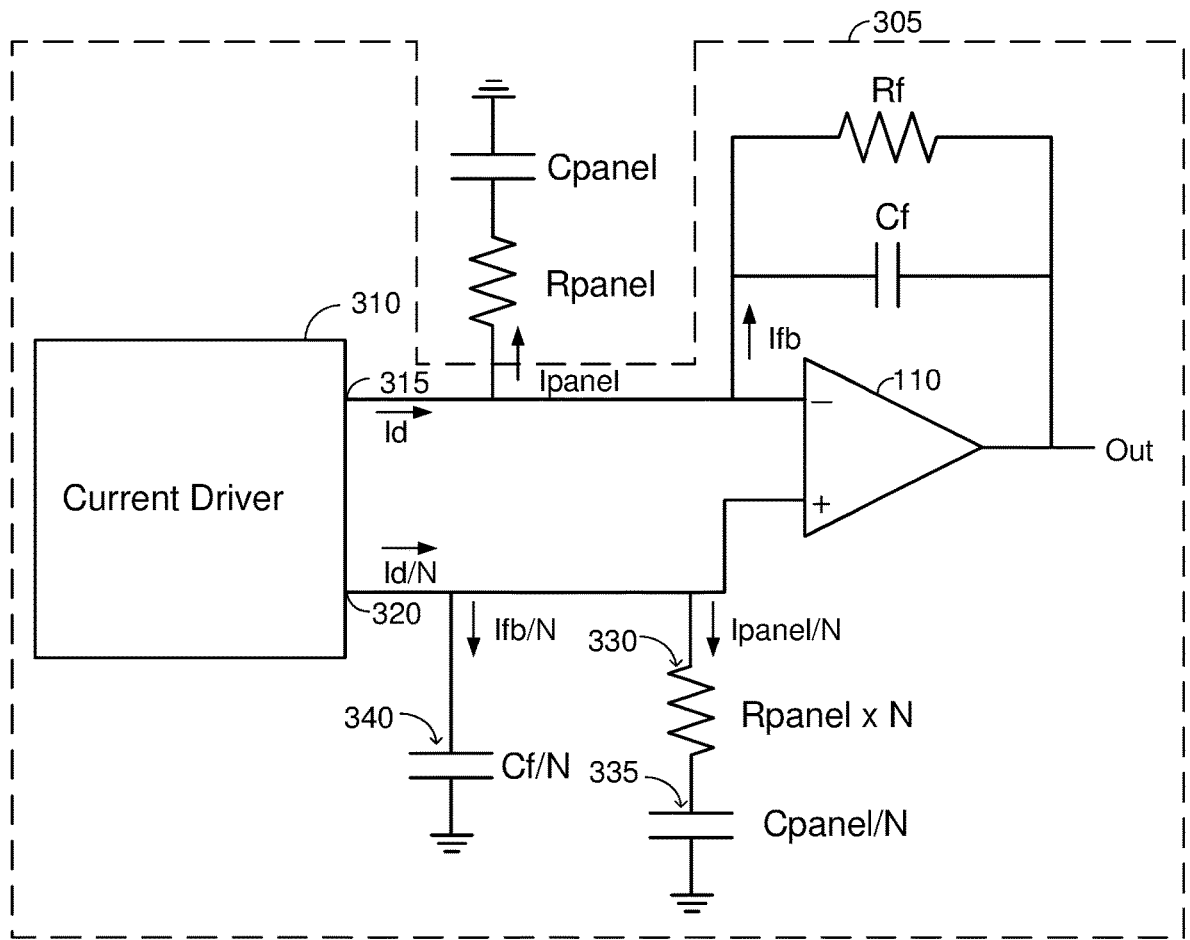
FIG. 3 shows an example of a current driver configured to provide an offset cancellation current according to certain aspects of the present disclosure.

FIG. 3 shows an example of an interface circuit 305 configured to drive and sense the capacitance of the touch panel capacitor Cpanel (e.g., self capacitor) according to certain aspects of the present disclosure. The interface circuit 305 overcomes one or more of the drawbacks associated with the offset cancellation circuit 210 in FIG. 2, as discussed further below.

The interface circuit 305 includes the amplifier 110, the feedback capacitor Cf, and the feedback resistor Rf discussed above. The description of the amplifier 110, the feedback capacitor Cf, and the feedback resistor Rf provided above applies to the interface circuit 305 in FIG. 3, and is not repeated here for brevity.

The interface circuit 305 also includes a drive resistor 330 and a drive capacitor 335 coupled in series between the positive input of the amplifier 110 and ground. The drive resistor 330 and/or the drive capacitor 335 may be integrated on the same chip as the amplifier 110. In certain aspects, the drive capacitor 335 is a scaled-down version of the touch panel capacitor Cpanel with a capacitance approximately equal to 1/N the baseline capacitance of the touch panel capacitor Cpanel, where N is a scaling factor. The drive resistor 330 is a scaled-up version of the resistor Rpanel with a resistance approximately equal to N times the resistance of the resistor Rpanel. As discussed above, the resistor Rpanel models the resistance of the electrode corresponding to the touch panel capacitor Cpanel.

The interface circuit 305 also includes a replica feedback capacitor 340 coupled between the positive input of the amplifier 110 and ground. The replica feedback capacitor 340 is a scaled-down version of the feedback capacitor Cf in the feedback path, and has a capacitance approximately equal to 1/N the capacitance of the feedback capacitor Cf.

The interface circuit 305 also includes a current driver 310 having a first output 315 coupled to the negative input of the amplifier 110, and a second output 320 coupled to the positive input of the amplifier 110. In certain aspects, the current driver 310 is configured to drive the drive capacitor 335 and the replica feedback capacitor 340 with a first drive current (denoted "Id/N"), and drive the touch panel capacitor Cpanel and the feedback capacitor Cf with a second drive current (denoted "Id"), in which the first drive current is approximately equal to 1/N the current of the second drive current. In other words, the second drive current is approximately equal to N times the current of the first drive current.

In the example in FIG. 3, the first drive current Id/N is split into a current Ifb/N that drives the replica feedback capacitor 340 and a current Ipanel/N that drives the drive capacitor 335. Thus, in this example, the current driver 310 drives the replica feedback capacitor 340 with the current Ifb/N and drives the drive capacitor 335 with the current Ipanel/N. The second drive current Id is split into a current Ifb that drives the feedback capacitor Cf and a current Ipanel that drives the touch panel capacitor Cpanel. Thus, in this example, the current driver 310 drives the feedback capacitor Cf with the current Ifb and drives the touch panel capacitor Cpanel with the current Ipanel. In this example, the current Ipanel/N is approximately equal to 1/N the current of the current Ipanel, and the current Ifb/N is approximately equal to 1/N the current of the current Ifb.

In operation, the current driver 310 drives the drive capacitor 335 and the replica feedback capacitor 340 with the first drive current Id/N to generate a voltage drive signal at the positive input of the amplifier 110. Thus, in this example, the voltage drive signal at the positive input of the amplifier is generated by driving the drive capacitor 335 and the replica feedback capacitor 340 with the first drive current Id/N instead of the voltage driver 120 in FIG. 2.

Figure 4:
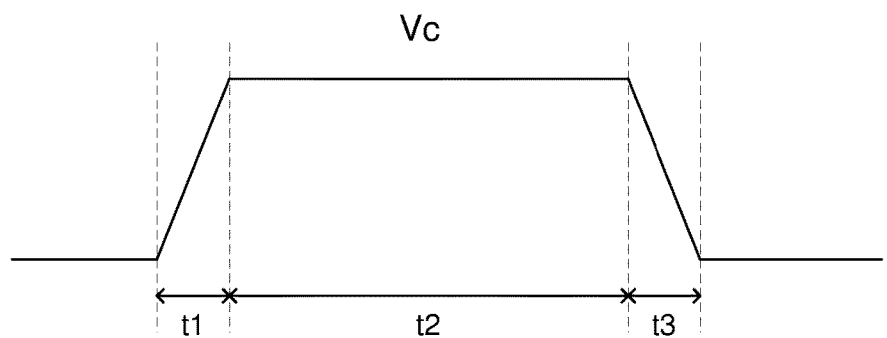
FIG. 4 shows an example of a trapezoidal drive voltage according to certain aspects of the present disclosure.

For example, the current driver 310 may drive the drive capacitor 335 and the replica feedback capacitor 340 with the first drive current Id/N to generate a voltage drive signal having a trapezoidal waveform. In this regard, FIG. 4 shows an example of a trapezoidal waveform. As shown in FIG. 4, the voltage ramps up to a voltage of approximately Vc over a first time interval (denoted "t1"), stays at a voltage of approximately Vc over a second time interval (denoted "t2"), and ramps down over a third time interval (denoted "t3"). In this example, the current driver 310 ramps up the voltage to approximately Vc by driving the first drive current into the drive capacitor 335 and the replica capacitor 340 over the first time interval t1. When the voltage reaches approximately Vc, the current driver 310 turns off the first drive current for the duration of the second time interval t2. During this time, the touch panel capacitor Cpanel holds the voltage at approximately Vc. At the end of the second time interval t2, the current driver 310 turns the first drive current back on in the reverse direction to ramp down the voltage. The reverse direction is the reverse of the direction indicated by the arrows in FIG. 3. In this example, the first drive current has an approximately constant magnitude in both directions.

The current driver 310 also drives the touch panel capacitor Cpanel and the feedback capacitor Cf with the second drive current Id, which is N times the current of the first drive current used to drive the drive capacitor 335 and the replica feedback capacitor 340. Since the capacitance of the drive capacitor 335 is approximately equal to 1/N the baseline capacitance of the touch panel capacitor Cpanel and the capacitance of the replica feedback capacitor 340 is approximately equal to 1/N the capacitance of the feedback capacitor Cf, the voltage at the negative input of the amplifier generated by driving the touch panel capacitor Cpanel and the feedback capacitor Cf with the second drive current Id approximately matches the voltage at the positive input of the amplifier generated by driving the drive capacitor 335 and the replica feedback capacitor 340 with the first drive current Id/N for the baseline case (i.e., the case in which the user's finger is not present).

For the example in which the current driver 310 drives the drive capacitor 335 and the replica feedback capacitor 340 with the first drive current Id/N to generate a trapezoidal voltage waveform at the positive input of the amplifier 110, the current driver 310 drives the touch panel capacitor Cpanel and the feedback capacitor Cf with the second drive current Id to generate a matching trapezoidal voltage waveform at the negative input of the amplifier 110 for the baseline case. In this example, the current driver 310 ramps up the voltage at the negative input to approximately Vc by driving the second drive current into the touch panel capacitor Cpanel and the feedback capacitor Cf over the first time interval t1. When the voltage reaches approximately Vc, the current driver 310 turns off the second drive current for the duration of the second time interval t2. During this time, the touch panel capacitor Cpanel holds the voltage at approximately Vc. At the end of the second time interval t2, the current driver 310 turns the second drive current back on in the reverse direction to ramp down the voltage. Note that the reverse direction is the reverse of the direction indicated by the arrows in FIG. 3.

Thus, for the baseline case (i.e., the case in which the user's finger is not present), the current driver 310 supplies the charge to the touch panel capacitor Cpanel and the feedback capacitor Cf needed to approximately match the voltage at the negative input of the amplifier 110 with the voltage at the positive inputs of the amplifier 110. This substantially cancels out the baseline capacitance from the output signal of the amplifier 110, thereby increasing the dynamic range of the amplifier 110.

When the user's finger is present, the change in the capacitance of the touch panel capacitor Cpanel (i.e., the delta capacitance) caused by the user's finger changes the amount of charge needed at the touch panel capacitor Cpanel to match the voltage at the negative of the amplifier 110 with the voltage at the positive input of the amplifier 110. In this case, the amplifier 110 provides the charge difference to the touch panel capacitor Cpanel to match the voltage at the negative input of the amplifier 110 with the voltage at the positive input of the amplifier 110. As a result, the output signal of the amplifier 110 is indicative of the change in the capacitance of the touch panel capacitor Cpanel (i.e., the delta capacitance) caused by the user's finger, and can therefore be used to detect the user's finger.

An advantage of the interface circuit 305 in FIG. 3 is that the drive capacitor 335 can be much smaller than the on-chip capacitor 225 shown in FIG. 2. This is because the on-chip capacitor 225 in FIG. 1 needs to be large in order to match the capacitance of the touch panel capacitor Cpanel, while the drive capacitor 335 is a scaled down version of the touch panel capacitor Cpanel. For example, if the scaling factor N equals 16, then the drive capacitor 335 is approximately 16 times smaller than the touch panel capacitor Cpanel, and therefore occupies a much smaller area on a chip. In certain aspects, the scaling factor may be at least four.

The drive resistor 330 has a larger resistance than the on-chip resistor 222 in FIG. 2. This is because the resistance of the drive resistor 330 is approximately equal to the panel resistance times the scaling factor N. However, the drive resistor 330 may be implemented in a much smaller area than the on-chip capacitor 225 shown in FIG. 2 using area efficient techniques such as implementing the drive resistor 330 with a switch-capacitor resistor. Thus, the total chip area occupied by the drive capacitor 335 and the drive resistor 330 may be much less than the total chip area occupied by the on-chip capacitor 225 and on-chip resistor 222 in FIG. 2, resulting in a net reduction in chip area.

In the above discussion, the current flow through the feedback resistor Rf was ignored. The feedback resistor Rf may have a resistance of several hundred K Ohms, in which case the current flow through the feedback resistor Rf is very small and introduces negligible error when ignored.

Figure 5:
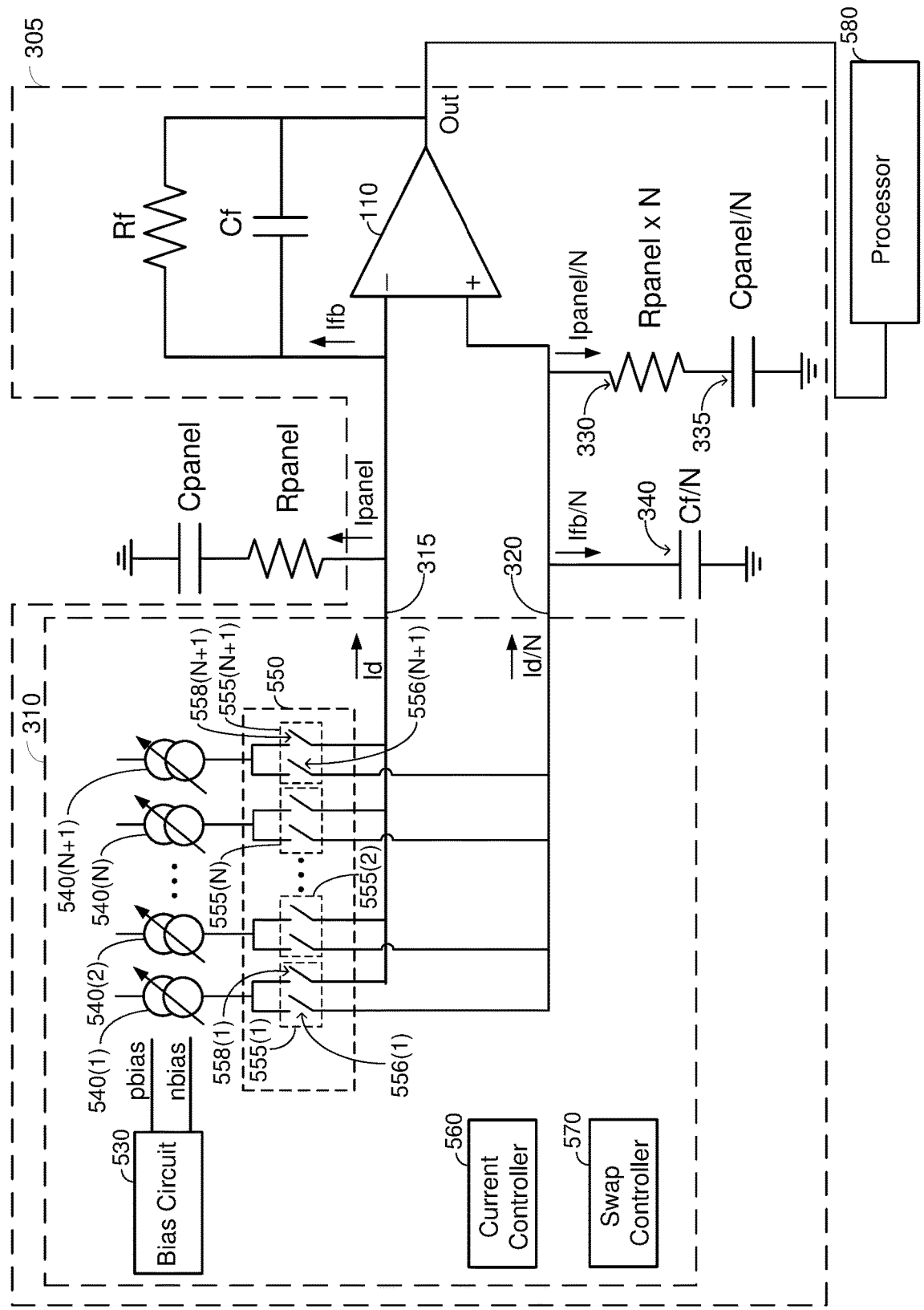
FIG. 5 shows an exemplary implementation of the current driver including multiple current sources that are swapped between first and second inputs of an amplifier in the interface circuit according to certain aspects of the present disclosure.

FIG. 5 shows an exemplary implementation of the current driver 310 including multiple current sources 540(1)-540(N+1), in which the current driver 310 swaps the current sources 540(1)-540(N+1) between the drive capacitor 335 and the touch panel capacitor Cpanel (i.e., between the positive and negative inputs of the amplifier 110) over multiple swapping cycles to reduce flicker noise. During each swapping cycle, one of the current sources is coupled to the drive capacitor 335 while the remaining N current sources are coupled to the touch panel capacitor Cpanel. At the start of each swapping cycle, the current source that is coupled to the drive capacitor 335 is changed such that each of the current sources takes a turn being coupled to the drive capacitor 335 over N+1 swapping cycles. Assuming each current source has approximately the same current, the current supplied to the drive current capacitor 335 is approximately equal to 1/N the current supplied to the touch panel capacitor Cpanel. Thus, at a given time, one of the current sources is coupled to the positive input of the amplifier 110 to provide the first drive current Id/N, and N of the current sources are coupled to the negative input of the amplifier 110 to provide the second drive current Id.

Swapping the current sources 540(1)-540(N+1) between the touch panel capacitor Cpanel and the drive capacitor 335 (i.e., between the positive and negative inputs of the amplifier 110) reduces transistor flicker noise at the output of the amplifier 110. This is because the flicker noise of each current source is applied to both inputs of the amplifier 110, and is therefore reduced through common mode rejection. This approach reduces flicker noise without having to increase the width and length of the transistors in the current sources, and is therefore a more chip area efficient solution to flicker noise.

In the example in FIG. 5, the current driver 310 includes a switching network 550, and a swap controller 570 for swapping the current sources 540(1)-540(N+1) between the drive capacitor 335 and the touch panel capacitor Cpanel (i.e., between the positive and negative inputs of the amplifier 110). The switching network 550 includes multiple switching devices 555(1)-555(N+1) where each switching device corresponds to a respective one of the current sources 540(1)-540(N+1). As shown in FIG. 5, each of the switching devices 555(1)-555(N+1) includes a respective first switch 556(1)-556(N+1) coupled between the respective current source and the drive capacitor 335 (i.e., the positive input of the amplifier 110) and a respective second switch 558(1)-558(N+1) coupled between the respective current source and the touch panel capacitor Cpanel (i.e., the negative input of the amplifier 110). In this example, a current source is coupled to the drive capacitor 335 by closing the first switch and opening the second switch in the respective switching device, and coupled to the touch panel capacitor Cpanel by opening the first switch and closing the second switch in the respective switching device. Note that the reference numbers for the switches in switching devices 555(2) and 555(N) are not shown in FIG. 5 to avoid cluttering FIG. 5. Also, note that the individual connections between the swap controller 570 and the switches are not explicitly shown in FIG. 5 for ease of illustration.

The swap controller 570 controls the switching devices 555(1)-555(N+1) to swap the current sources 540(1)-540(N+1) between the drive capacitor 335 and the touch panel capacitor Cpanel (i.e., between the positive and negative inputs of the amplifier 110) over multiple swapping cycles. During each swapping cycle, the swap controller 570 couples one of the current sources to the drive capacitor 335 by closing the first switch and opening the second switch in the respective switching device, and couples each of the remaining N current sources to the touch panel capacitor Cpanel by opening the first switch and closing the second switch in the respective switching device. The swap controller 570 controls the switching devices such that the current source that is coupled to the drive capacitor 335 is changed at the start of each swapping cycle and each of the current sources takes a turn being coupled to the drive capacitor 335 over N+1 swapping cycles.

In certain aspects, the output signal of the amplifier 110 is output to a processor 580, which processes the output signal to detect the presence of a user's finger at or near the touch panel capacitor Cpanel. For example, the processor 580 may integrate the output signal over an integration time interval, and determine whether the user's finger is present based on the magnitude of the resulting integrated signal. In this example, the magnitude of the integrated signal when the user's finger is present differs from the magnitude of the integrated signal when the user's finger is not present, allowing the processor to determine whether the user's finger is present based on the magnitude of the integrated signal. The integration time interval may span at least N+1 swapping cycles so that each current source takes at least one turn being coupled to the drive capacitor 335 during the integration time interval.

It is to be appreciated that each of the current sources 540(1)-540(1+N) shown in FIG. 5 may be made up of multiple smaller current sources (e.g., multiple smaller current source coupled in parallel).

Figure 6:
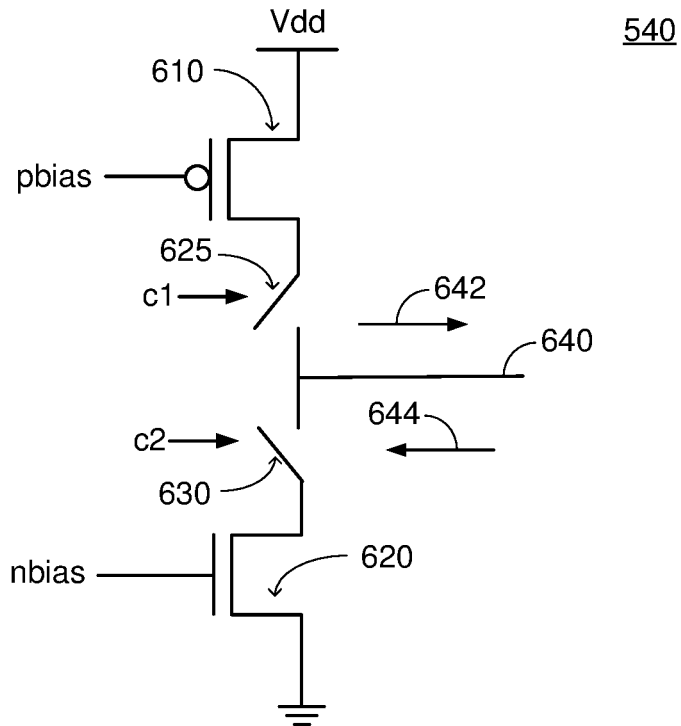
FIG. 6 shows an exemplary implementation of one of the current sources according to certain aspects of the present disclosure.

FIG. 6 shows an exemplary implementation of a current source 540 according to certain aspects of the present disclosure. The current source 540 may be used to implement each of the current sources 540(1)-540(N+1) shown in FIG. 5. In other words, each of the current sources 540(1)-540(N+1) may be a separate instance (copy) of the current source 540 in FIG. 6.

The current source 540 includes a p-type field effect transistor (PFET) 610, a first switch 625, a second switch 630, and an n-type field effect transistor (NFET) 620. The PFET 610 and the first switch 625 are coupled in series between the supply rail Vdd and the output 640 of the current source 540. The NFET 620 and the second switch 630 are coupled in series between the output 640 of the current source 540 and ground. The output 640 is coupled to the respective one of the switching devices 555(1)-555(N+1) (shown in FIG. 5). The respective switching device couples the output 640 to either the touch panel capacitor Cpanel or the drive capacitor 335 under the control the swap controller 570, as discussed above.

The gate of the PFET 610 is biased by a first bias voltage (denoted "pbias"), and the gate of the NFET 620 is biased by a second bias voltage (denoted "nbias"). In this regard, the interface circuit 305 includes a bias circuit 530 (shown in FIG. 5) for generating the bias voltages pbias and nbias. The first bias voltage pbias controls the amount of current that flows through the PFET 610 by controlling the channel conductance of the PFET 610. Similarly, the second bias voltage nbias controls the amount of current that flows through the NFET 620 by controlling the channel conductance of the NFET 620.

The first switch 625 receives a first control signal (denoted "c1"), and the second switch 630 receives a second control signal (denoted "c2"). Each of the control signals c1 and c2 controls the respective switch. In this regard, the interface circuit 305 includes a current controller 560 that generates the control signals c1 to c2 to control the currents of the current sources 540(1)-540(N+1), as discussed further below. Note that the individual connections between the current controller 560 and the current sources 540(1)-540(N+1) are not explicitly shown in FIG. 5 for ease of illustration.

In operation, the current controller 560 causes the current source 540 to provide a current in direction 642 by closing the first switch 625 and opening the second switch 630. In this case, the current flows into the touch panel capacitor Cpanel and the feedback capacitor Cf or into the drive capacitor 335 and the replica capacitor 340 depending on which one of the inputs of the amplifier the current source 540 is coupled to by the respective switching device at a given time. The current level of the current in direction 642 is controlled by the first bias voltage pbias, as discussed above.

The current controller 560 causes the current source 540 to provide a current in direction 644 by opening the first switch 625 and closing the second switch 630, in which direction 644 of the current is the reverse of direction 642. In this case, the current flows out of the touch panel capacitor Cpanel and the feedback capacitor Cf or out of the drive capacitor 335 and the replica feedback capacitor 340 depending on which one of the inputs of the amplifier the current source 540 is coupled to by the respective switching device at a given time. The current level of the current in direction 644 is controlled by the second bias voltage nbias, as discussed above.

The current controller 560 turns off the current source 540 by opening both the first switch 625 and the second switch 630.

In certain aspects, the current controller 560 may control the current sources 540(1)-540(1+N) to generate trapezoidal voltage waveforms at the inputs of the amplifier 110. For example, with reference to FIG. 4, the current controller 560 may generate a trapezoidal voltage waveform at each input of the amplifier 110 by performing the following steps. The current controller 560 may first ramp up the voltage at each input over the first time interval t1 by closing the first switch and opening the second switch in each current source. The current controller 560 may then turn off the current sources over the second time interval t2 by opening the first and second switches in each current source. At the end of the second time interval t2, the current controller 560 may ramp down the voltage at each input over the third time interval t3 by opening the first switch and closing the second switch in each current source.

The current controller 560 may sequentially generate multiple trapezoidal voltage waveforms at each input of the amplifier 110 over multiple drive cycles by repeating the above steps for each drive cycle. In this case, a trapezoidal voltage waveform is generated at each input during each drive cycle. In one example, each drive cycle may correspond to one swapping cycle. In this example, the swap controller 570 may change the current source 540(1)-540(1+N) that is coupled to the positive input of the amplifier 110 between adjacent trapezoidal voltage waveforms. In another example, each drive cycle may span multiple swapping cycles. In this example, the swap controller 570 may also change the current source that is coupled to the positive input of the amplifier 110 during each trapezoidal waveform (e.g., between the voltage ramp up and the voltage ramp down of the trapezoidal waveform).

In the above example, the PFETs and the NFETs in the current sources 540(1)-540(N+1) are switched on and off at a switching frequency. This shifts the flicker noise of the PFETs and the NEFTs in frequency by the switching frequency. This flicker noise is reduced by swapping the current sources 540(1)-540(N+1) between the inputs of the amplifier 110, as discussed above.

It is to be appreciated that the present disclosure is not limited to the example of trapezoidal voltage waveforms, and that the current driver 310 may drive the capacitors with currents to generate other types of voltage waveforms.

Figure 7:
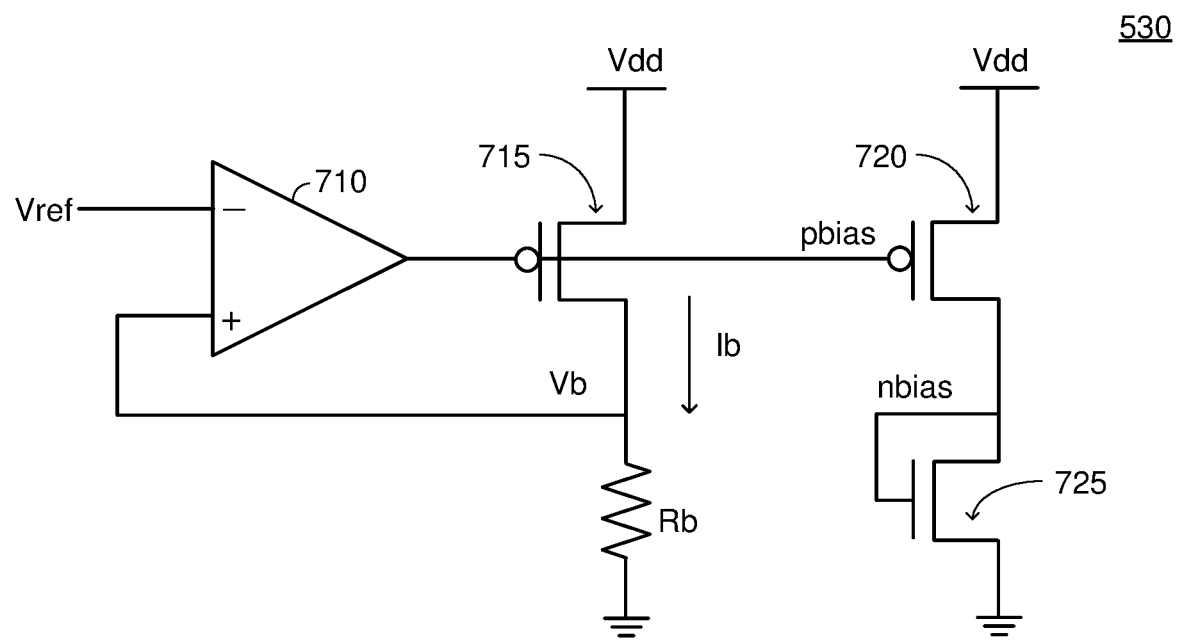
FIG. 7 shows an exemplary implementation of a bias circuit for the current sources according to certain aspects of the present disclosure.

FIG. 7 shows an exemplary implementation of the bias circuit 530 according to certain aspects of the present disclosure. As discussed above, the bias circuit 530 generates the bias voltages pbias and nbias that control the current levels of the current sources 540(1)-540(N+1). In this example, the bias circuit 530 includes an amplifier 710, a first bias PFET 715, and a bias resistor Rb.

The first bias PFET 715 and the bias resistor Rb are coupled in series between the supply rail Vdd and ground. The positive input of the amplifier 710 is coupled to the node between the first bias PFET 715 and the bias resistor Rb, and the negative input of the amplifier 710 receives a reference voltage (denoted "Vref"). Also, the output of the amplifier 710 is coupled to the gate of the first bias PFET 715. Thus, the output voltage of the amplifier 710 controls the channel conductance of the first bias PFET 715. As discussed further below, the output voltage of the amplifier 715 provides the first bias voltage pbias.

In this example, the voltage across the bias resistor (denoted "Vb") is fed back to the amplifier 710. This causes the amplifier 710 to adjust the output voltage of the amplifier 710 (and hence the conductance of the first bias PFET 715) such that the voltage Vb across the resistor Rb is approximately equal to the reference voltage Vref. In this case, the current through the first bias PFET 715 (denoted "Ib") is approximately equal to Vref/Rb. Thus, the current Ib through the first bias PFET 715 may be set to a desired current level by setting the reference voltage Vref and/or the resistance of the bias resistor Rb accordingly.

The output voltage of the amplifier 710 provides the first bias voltage pbias, which is output to the gates of the PFETs in the current sources 540(1)-540(1+N). Thus, if the first bias PFET 715 approximately matches the PFETs in the current sources 540(1)-540(1+N), then the first bias voltage pbias causes each of the PFETs in the current sources to conduct a current approximately equal to the current Ib in the bias circuit 530.

The bias circuit 530 also includes a second bias PFET 720 and a bias NFET 725 coupled in series between the supply rail Vdd and ground. The drain and gate of the bias NFET 725 are tied together. As discussed further below, the second bias voltage nbias is generated at the gate of the bias NFET 725.

The gate of the second bias PFET 720 is biased by the first bias voltage pbias. Thus, the current flowing through the second bias PFET 720 is approximately equal to the current Ib assuming the first and second bias PFETs 715 and 720 are matched. The current flowing through the second bias PFET 720 also flows through the bias NFET 725 since the second bias PFET 720 and the bias NFET 725 are coupled in series. The current flow through the bias NFET 725 causes the second bias voltage nbias to be generated at the gate of the bias NFET 725. Since the current flowing through the bias NFET 725 is approximately equal to the current Ib, the second bias voltage nbias corresponds to the current Ib. Thus, if the bias NFET 725 approximately matches the NFETs in the current sources 540(1)-540(1+N), then the second bias voltage nbias causes each of the NFETs in the current sources to conduct a current approximately equal to the current Ib.

In the above example, the bias voltages pbias and nbias cause each of the current sources 540(1)-540(N+1) to provide a current approximately equal to the current Ib in the bias circuit 530. Since the current Ib is approximately equal to Vref/Rb, the current of each current source may be set to a desired current level by setting the reference voltage Vref and/or the resistance of the bias resistor Rb accordingly.

It is to be appreciated that the current of each current source may be scaled with respect to the current Ib in the bias circuit 530. For example, the width of each transistor in the current sources may be M times the width of each bias transistor in the bias circuit 530, where M is a current scaling factor. In this example, the current of each current source is approximately equal to M times the current Ib. Thus, in this example, the current of each current source may also be set to a desired current level by setting the current scaling factor M accordingly.

In certain aspects, each of the current sources 540(1)-540(N+1) may include a multi-bit current source. The multi-bit current source is configured to provide current at one of multiple selectable current levels according to a multi-bit value input to the multi-bit current source. Each of the selectable current levels may be a different multiple of a base current level, in which the base current level is set by the bias voltages pbias and nbias discussed above. For example, a two-bit current source may provide one of two current levels according to a one bit value, in which one of the two current levels is equal to the base current level, and the other one of the two current levels is equal to twice the base current level or another multiple of the base current.

Figure 8:
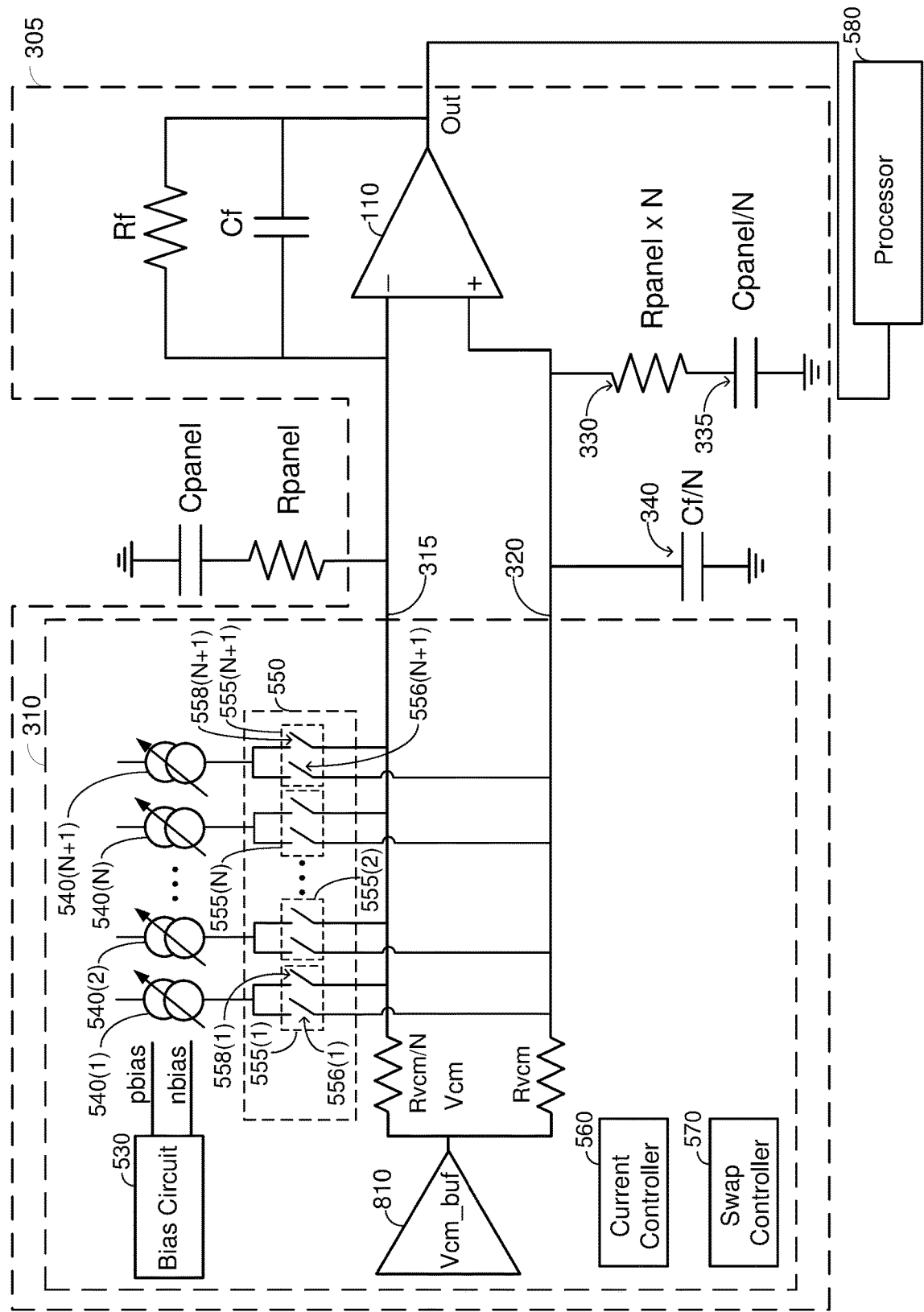
FIG. 8 shows an example in which the first and second inputs of the amplifier are weakly coupled to a voltage buffer according to certain aspects of the present disclosure.

As discussed above, the current sources 540(1)-540(N+1) may include PFETs for providing current in direction 642, and NFETs for providing current in direction 644. There may be a small difference in the currents provided by the PFETs and the NFETs, resulting in a delta current. In this case, the delta current may integrate on the drive capacitor 335 and touch panel capacitor Cpanel over time, causing the DC voltages at the inputs of the amplifier 110 to drift up or down over time. If not corrected, this may cause the current sources to cut off. To address this, the interface circuit 305 may include a voltage buffer 810, a first resistor Rvcm, and a second resistor Rvcm/N, as shown in the example in FIG. 8. The resistance of the second resistor Rvcm/N is approximately 1/N the resistance of the first resistor Rvcm.

In this example, the voltage buffer 810 is configured to output a DC voltage (denoted "Vcm"), which may be approximately equal to half the supply voltage of the amplifier 110. The positive input of the amplifier 110 is weakly coupled to the voltage buffer 810 by the first resistor Rvcm, and the negative input of the amplifier 110 is weakly coupled to the voltage buffer 810 by the second resistor Rvcm/N, assuming the resistances of the resistors are relatively high. For example, the first resistor Rvcm may have a resistance of 1.25 M Ohms. The high resistances of the resistors may be realized in a small area by implementing the resistors with switch-capacitor resistors. The resistors help prevent the DC voltages at the inputs of the amplifier 110 from drifting up or down over time due to the delta current discussed above by pulling the DC voltages toward Vcm. For example, if the delta current is approximately 0.1 µA and the resistance of the first resistor Rvcm is approximately 1.25 M Ohms, then the DC voltage at the positive input settles to approximately Vcm+125 mV. If the drive signal is a trapezoidal signal, then the trapezoidal signal is approximately centered about Vcm+125 mV in this example. It is to be appreciated that other techniques may be employed to mitigate the delta current discussed above.

Figure 9:
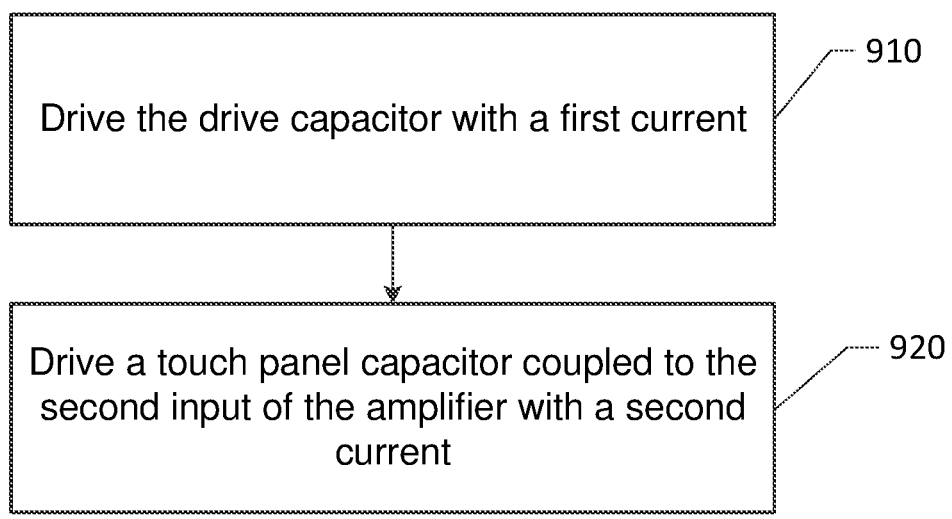
FIG. 9 is a flowchart illustrating a method for operating an interface circuit to a touch panel according to certain aspects of the present disclosure.

FIG. 9 is a flowchart illustrating a method 900 for operating an interface circuit to a touch panel according to certain aspects. The interface circuit (e.g., the interface circuit 305) includes an amplifier (e.g., the amplifier 110), a drive capacitor (e.g., the drive capacitor 335) coupled to a first input of the amplifier (e.g., positive input of the amplifier 110), and a feedback path coupled between an output of the amplifier and a second input of the amplifier (e.g., negative input of the amplifier 110).

At block 910, the drive capacitor is driven with a first current. For example, the drive capacitor may be driven with the first current (e.g., Ipanel/N) to generate a drive voltage at the first input of the amplifier (e.g., positive input of the amplifier 110).

At block 920, a touch panel capacitor coupled to the second input of the amplifier is driven with a second current. For example, the touch panel capacitor (e.g., self capacitor) may be driven with the second current (e.g., Ipanel) to generate a voltage at the second input of the amplifier (e.g., negative input of the amplifier 110) approximately matching the drive voltage at the first input of the amplifier for the baseline case of the touch panel capacitor. This may be done to substantially cancel out the baseline capacitance of the touch panel capacitor from the output of the amplifier.

The method 900 may also include the optional steps of generating the first and second currents using current sources (e.g., the current sources 540(1)-540(1+N)), and swapping the current sources between the first input of the amplifier and the second input of the amplifier. This may be done to reduce flicker noise from transistors in the current sources.

It is to be appreciated that the present disclosure is not limited to the particular terms used above to describe aspects of the present disclosure, and that the present disclosure also covers equivalent terms. For example, it is to be appreciated that a touch panel may also be referred to as a touch screen, a touch interface, or another term. In another example, it is to be appreciated that a current source may also be referred to as a current cell or another term. In yet another example, it is to be appreciated that the term "swap" may also be referred to as exchange, switch or another term.

In the above example, the touch panel capacitor Cpanel is used to detect a user's finger. However, it is to be appreciated that the present disclosure is not limited to this example, and that the touch panel capacitor Cpanel may be used to detect another object (e.g., stylus) at or near the touch panel capacitor Cpanel, in which the object changes (alters) the capacitance of the touch panel capacitor Cpanel. In this case, the baseline capacitance of the touch panel capacitor Cpanel is the capacitance of the touch panel capacitor Cpanel when the object is not present.

It is to be appreciated that the touch panel capacitor Cpanel may include a self capacitor, a self capacitor and a mutual capacitor in parallel, and/or another type of touch sensitive capacitor.

The term "approximately", as used herein with respect to a stated value or a property, is intended to indicate being within 20% of the stated value or property.

Further, it is to be appreciated that the present disclosure is not limited to coupling the feedback path and the touch panel capacitor Cpanel to a negative input of the amplifier 110, and coupling the drive capacitor 335 to a positive input of the amplifier 110. In general, the drive capacitor 335 and the replica feedback capacitor 340 are coupled to a first input of the amplifier 110, and the feedback path and the touch panel capacitor Cpanel are coupled to a second input of the amplifier 110.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element. These designations may also be used as a convenient way of distinguishing between two or more currents. For example, "first" may be used to designate any one of the currents discussed above, and "second" may be used to designate another one of the currents discussed above.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The current controller 560 and the swap controller 570 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An interface circuit comprising:
an amplifier having a first input, a second input, and an output;
a drive capacitor coupled to the first input of the amplifier;
a feedback path coupled between the output of the amplifier and the second input of the amplifier; and
a current driver coupled to the first input of the amplifier and the second input of the amplifier, wherein the current driver is configured to drive the drive capacitor with a first current, and to drive a touch panel capacitor coupled to the second input of the amplifier with a second current, wherein a capacitance of the drive capacitor is approximately equal to 1/N of a baseline capacitance of the touch panel capacitor where N is a scaling factor.

2. The interface circuit of claim 1, wherein a current level of the first current is approximately equal to 1/N of a current level of the second current.

3. The interface circuit of claim 2, wherein the current driver is configured to drive the drive capacitor with the first current to generate a first voltage waveform at the first input of the amplifier.

4. The interface circuit of claim 3, wherein the current driver is configured to drive the touch panel capacitor with the second current to generate a second voltage waveform at the second input of the amplifier.

5. The interface circuit of claim 4, wherein the first voltage waveform approximately matches the second voltage waveform for a baseline case of the touch panel capacitor.

6. The interface circuit of claim 4, wherein the first voltage waveform comprises a first trapezoidal voltage waveform, and the second voltage waveform comprises a second trapezoidal voltage waveform.

7. The interface circuit of claim 1, wherein the touch panel capacitor comprises a self capacitor in a touch panel.

8. The interface circuit of claim 1, wherein the feedback path includes a feedback capacitor.

9. The interface circuit of claim 8, further comprising a replica feedback capacitor coupled to the first input of the amplifier.

10. The interface circuit of claim 9, wherein a capacitance of the replica feedback capacitor is approximately equal to 1/N of a capacitance of the feedback capacitor in the feedback path.

11. The interface circuit of claim 1, wherein the drive capacitor is coupled between the first input of the amplifier and a ground.

12. The interface circuit of claim 1, wherein the current driver comprises current sources, and the current driver is configured to swap the current sources between the first input of the amplifier and the second input of the amplifier.

13. The interface circuit of claim 12, wherein the current driver is configured to swap the current sources over multiple swapping cycles such that, during each of the multiple swapping cycles, a different one of the current sources is coupled to the first input of the amplifier.

14. The interface circuit of claim 13, wherein each of the current sources takes a turn being coupled to the first input of the amplifier over the multiple swapping cycles.

15. A method for operating an interface circuit to a touch panel, the interface circuit including an amplifier, a drive capacitor coupled to a first input of the amplifier, and a feedback path coupled between an output of the amplifier and a second input of the amplifier, the method comprising:
    driving the drive capacitor with a first current; and
    driving a touch panel capacitor coupled to the second input of the amplifier with a second current, wherein a capacitance of the drive capacitor is approximately equal to 1/N of a baseline capacitance of the touch panel capacitor where N is a scaling factor.

16. The method of claim 15, wherein a current level of the first current is approximately equal to 1/N of a current level of the second current.

17. The method of claim 16, wherein driving the drive capacitor with the first current comprises driving the drive capacitor with the first current to generate a first voltage waveform at the first input of the amplifier.

18. The method of claim 17, wherein driving the touch panel capacitor with the second current comprises driving the touch panel capacitor with the second current to generate a second voltage waveform at the second input of the amplifier.

19. The method of claim 18, wherein the first voltage waveform approximately matches the second voltage waveform for a baseline case of the touch panel capacitor.

20. The method of claim 18, wherein the first voltage waveform comprises a first trapezoidal voltage waveform, and the second voltage waveform comprises a second trapezoidal voltage waveform.

21. The method of claim 15, wherein the touch panel capacitor comprises a self capacitor in the touch panel.

22. The method of claim 15, further comprising:
    generating the first and second currents using current sources; and
    swapping the current sources between the first input of the amplifier and the second input of the amplifier.

23. The method of claim 22, wherein swapping the current sources comprises swapping the current sources between the first input of the amplifier and the second input of the amplifier over multiple swapping cycles such that, during each of the multiple swapping cycles, a different one of the current sources is coupled to the first input of the amplifier.

24. The method of claim 23, wherein each of the current sources takes a turn being coupled to the first input of the amplifier over the multiple swapping cycles.

* * * * *